(12) United States Patent
Sekisawa et al.

(10) Patent No.: US 11,557,618 B2
(45) Date of Patent: Jan. 17, 2023

(54) SOLID-STATE IMAGE SENSOR AND IMAGE READING DEVICE

(71) Applicant: Seiko Epson Corporation, Tokyo (JP)

(72) Inventors: Mitsuo Sekisawa, Sakata (JP); Kazunobu Kuwazawa, Sakata (JP)

(73) Assignee: SEIKO EPSON CORPORATION

( * ) Notice: Subject to any disclaimer, the term of this patent is extended or adjusted under 35 U.S.C. 154(b) by 229 days.

(21) Appl. No.: 16/856,337

(22) Filed: Apr. 23, 2020

(65) Prior Publication Data

US 2020/0343288 A1 Oct. 29, 2020

(30) Foreign Application Priority Data

Apr. 24, 2019 (JP) .............................. JP2019-082688
Jan. 7, 2020 (JP) .............................. JP2020-000689

(51) Int. Cl.
*H01L 27/146* (2006.01)

(52) U.S. Cl.
CPC .. *H01L 27/14623* (2013.01); *H01L 27/14603* (2013.01); *H01L 27/14609* (2013.01); *H01L 27/14636* (2013.01); *H01L 27/14683* (2013.01)

(58) Field of Classification Search
CPC ......... H01L 27/14623; H01L 27/14636; H01L 27/14603
See application file for complete search history.

(56) References Cited

U.S. PATENT DOCUMENTS

| | | | | | |
|---|---|---|---|---|---|
| 6,150,676 | A | * | 11/2000 | Sasaki | H04N 5/35518 257/446 |
| 6,828,541 | B2 | * | 12/2004 | Komaba | H01L 27/1463 250/214.1 |
| 6,970,293 | B2 | * | 11/2005 | Natori | H01L 31/02327 257/E31.128 |
| 7,283,305 | B2 | * | 10/2007 | Okita | H01L 27/14627 257/E31.128 |
| 7,297,919 | B2 | * | 11/2007 | Mishina | H01L 27/14623 257/432 |
| 7,470,944 | B2 | * | 12/2008 | Ishida | H01L 27/14698 257/292 |
| 7,638,804 | B2 | * | 12/2009 | Kido | H01L 27/14641 257/434 |
| 8,030,723 | B2 | * | 10/2011 | Lee | H01L 27/14629 257/435 |

(Continued)

FOREIGN PATENT DOCUMENTS

| | | |
|---|---|---|
| JP | H08-148662 A | 6/1996 |
| JP | 2016-100509 A | 5/2016 |
| JP | 2018-050028 A | 3/2018 |

*Primary Examiner* — David A Zarneke
(74) *Attorney, Agent, or Firm* — Harness, Dickey & Pierce, P.L.C.

(57) ABSTRACT

A solid-state image sensor including: a first impurity region of a first conductivity type; a plurality of second impurity regions of a second conductivity type disposed in the first impurity region and arranged in a first direction; and a light shielding layer that overlaps the first impurity region and does not overlap the second impurity regions in a plan view, wherein the first impurity region has a first portion between adjacent ones of the second impurity regions, the light shielding layer has a second portion that overlaps the first portion in a plan view, and a length of the second portion in the first direction is smaller than a length of the first portion in the first direction.

10 Claims, 14 Drawing Sheets

(56) References Cited

U.S. PATENT DOCUMENTS

| | | | |
|---|---|---|---|
| 9,130,077 B2* | 9/2015 | Weng | H01L 31/18 |
| 9,224,781 B2* | 12/2015 | Chou | H01L 27/14621 |
| 9,281,333 B2* | 3/2016 | Lin | H01L 27/14625 |
| 9,590,005 B1* | 3/2017 | Qian | H01L 27/14643 |
| 9,911,768 B2* | 3/2018 | Nakamura | H01L 27/14623 |
| 11,315,972 B2* | 4/2022 | Hsu | H01L 27/1464 |
| 2009/0309010 A1* | 12/2009 | Lee | H01L 27/14623 |
| | | | 257/E31.127 |
| 2011/0063486 A1* | 3/2011 | Saeki | H01L 27/14627 |
| | | | 257/E31.127 |
| 2016/0148968 A1 | 5/2016 | Nakamura | |
| 2018/0076255 A1 | 3/2018 | Kuwazawa et al. | |
| 2021/0272997 A1* | 9/2021 | Lee | H01L 27/14603 |
| 2022/0059593 A1* | 2/2022 | Seki | H04N 5/369 |

* cited by examiner

SOLID-STATE IMAGE SENSOR AND IMAGE READING DEVICE

The present application is based on, and claims priority from Japanese Patent Application Serial Number 2019-082688, filed on Apr. 24, 2019, and Japanese Patent Application Serial No. 2020-000689, filed on Jan. 7, 2020, the disclosures of which are hereby incorporated by reference herein in their entirety.

BACKGROUND

1. Technical Field

The present invention relates to a solid-state image sensor and an image reading device.

2. Related Art

Scanners that use a solid-state image sensor such as a CIS (Contact Image Sensor), as well as copy machines, multi-function printers, and the like that have a print function in addition to a scanner are being developed. A line sensor used in scanners is configured by arranging a plurality of solid-state image sensors, in which a plurality of pixels are arranged in one direction. For example, JP-A-2016-100509 discloses that an n-type diffusion layer constitutes a photodiode, and the photodiode constitutes a pixel.

JP-A-2016-100509 is an example of the related art.

Adjacent n-type diffusion layers are electrically separated by a p-type diffusion layer. A solid-state image sensor is designed such that an n-type diffusion layer is completely depleted and serves as a depletion layer, and the depletion layer also extends from a boundary between the n-type diffusion layer and the p-type diffusion layer toward the p-type diffusion layer. Carriers that have undergone photoelectric conversion can be accumulated in the depletion layer, and thus, if light incident on the depletion layer is blocked by a light shielding layer, the solid-state image sensor may become less sensitive.

SUMMARY

In an aspect, a solid-state image sensor according to the present disclosure includes:
a first impurity region of a first conductivity type;
a plurality of second impurity regions of a second conductivity type disposed in the first impurity region and arranged in a first direction; and
a light shielding layer that overlaps the first impurity region and does not overlap the second impurity regions in a plan view,
wherein the first impurity region has a first portion between adjacent ones of the second impurity regions,
the light shielding layer has a second portion that overlaps the first portion in a plan view, and
a length of the second portion in the first direction is smaller than a length of the first portion in the first direction.

In an aspect of the solid-state image sensor,
the light shielding layer may be an interconnect layer electrically coupled to the first impurity region.

In an aspect of the solid-state image sensor,
a ground potential may be applied to the light shielding layer.

In an aspect of the solid-state image sensor,
in a plan view, a first distance between one of adjacent ones of the second impurity regions and the second portion may be equal to a second distance between another one of the adjacent ones of the second impurity regions and the second portion.

In an aspect of the solid-state image sensor,
an impurity concentration in the second impurity regions may be $1\times10^{15}$ atom/cm$^3$ or more and $1\times10^{17}$ atom/cm$^3$ or less, and
the first distance and the second distance may be 0.4 μm.

In an aspect of the solid-state image sensor,
the solid-state image sensor may further include depletion layers constituted by the second impurity regions and portions of the first impurity region,
wherein the length of the second portion in the first direction may be smaller than or equal to a distance between adjacent ones of the depletion layers in the first direction.

In an aspect of the solid-state image sensor,
the light shielding layer may have a third portion,
in a plan view, the third portion may be located in a second direction with respect to the second impurity regions, the second direction being orthogonal to the first direction, and
in a plan view, the third portion may be spaced apart from the second impurity regions.

In an aspect of the solid-state image sensor,
the solid-state image sensor may further include another light shielding layer that overlaps the light shielding layer in a plan view,
wherein the other light shielding layer may have a fourth portion that overlaps the first portion in a plan view, and
a length of the fourth portion in the first direction may be smaller than the length of the first portion in the first direction.

In an aspect, an image reading device according to the present disclosure includes:
a light source; and
the solid-state image sensor in an aspect that reads an image formed on a medium to be read, based on light that is light applied by the light source reflected off the medium to be read.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, preferable embodiments of the present disclosure will be described in detail with reference to the drawings. Note that the following embodiments are not intended to unjustly limit the content of the present disclosure described in the claims. Not all of the configurations described below are necessarily essential constituent elements for the present disclosure.

1. First Embodiment 1.1. Solid-State Image Sensor

Figure 1:
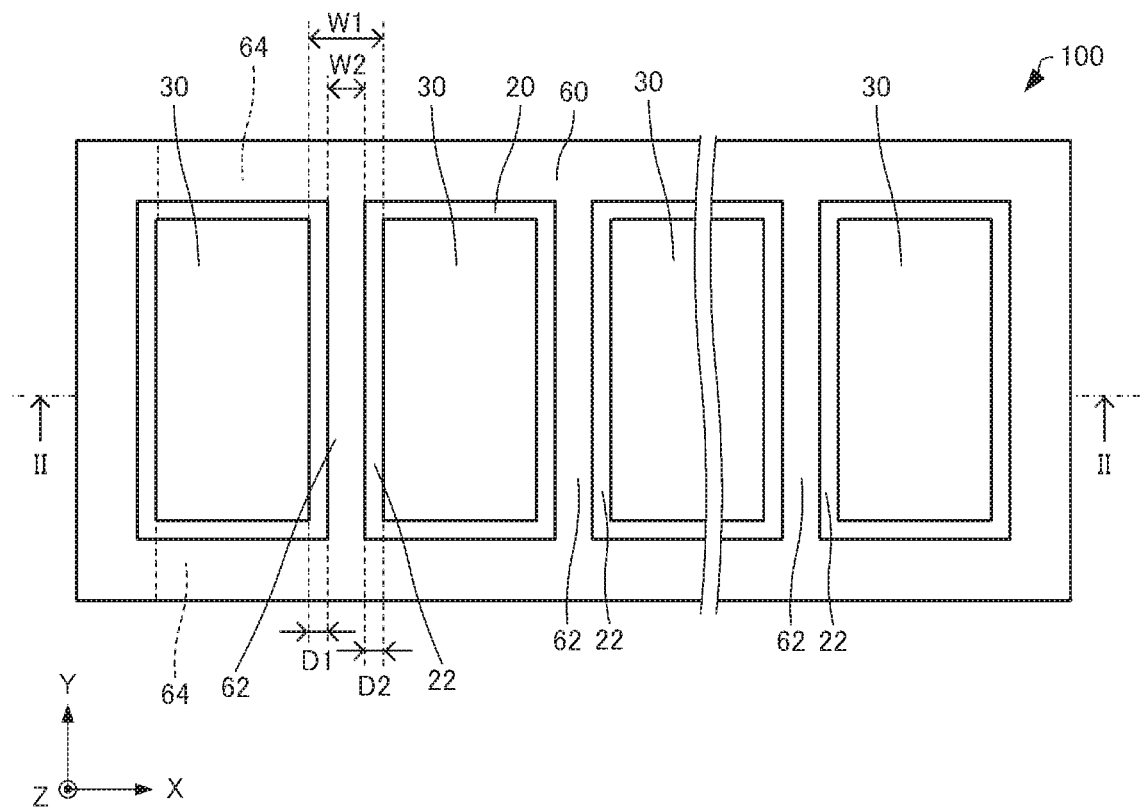
FIG. 1 is a plan view schematically showing a solid-state image sensor according to a first embodiment.
Figure 2:
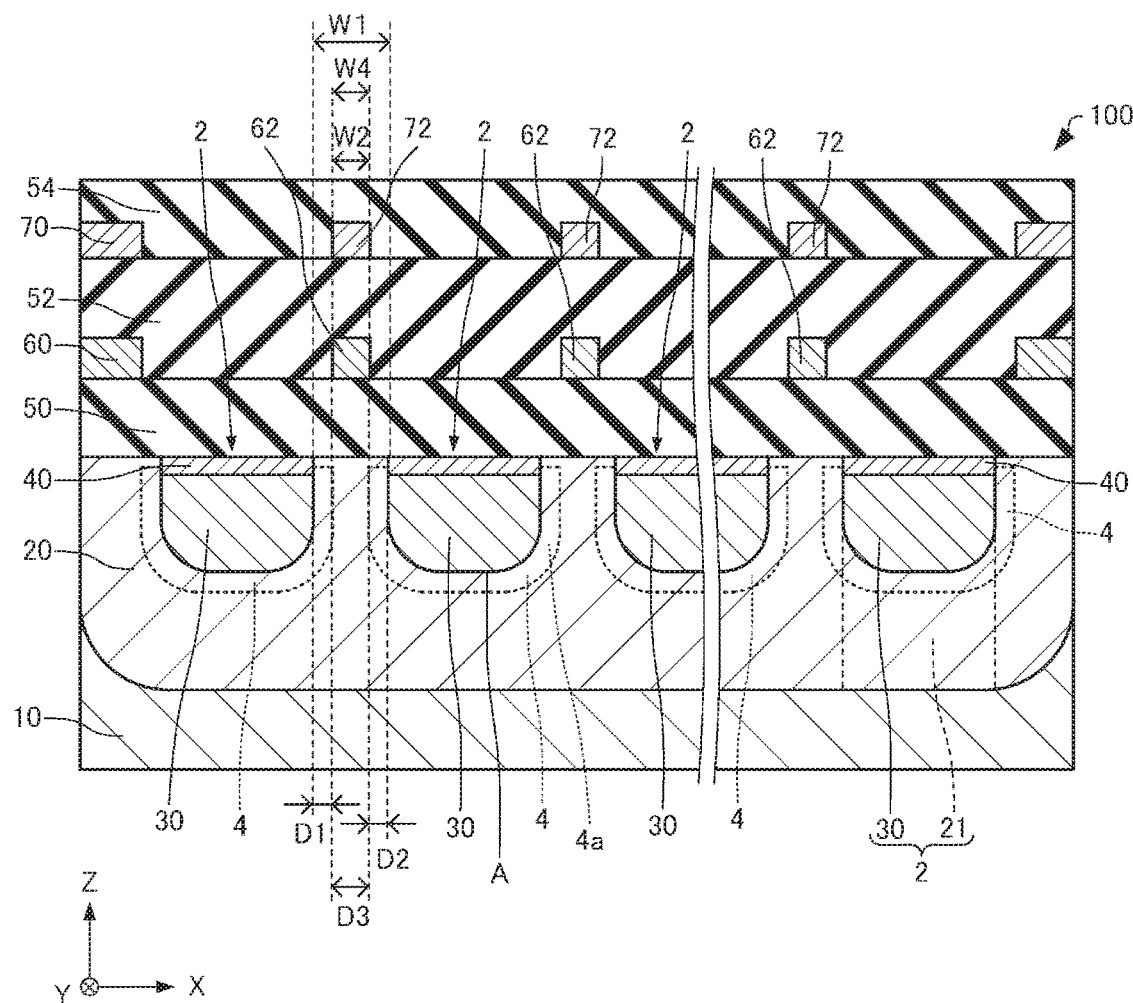
FIG. 2 is a cross-sectional view schematically showing the solid-state image sensor according to the first embodiment.

First, a solid-state image sensor according to the first embodiment will be described with reference to the drawings. FIG. 1 is a plan view schematically showing a solid-state image sensor 100 according to the first embodiment. FIG. 2 is a cross-sectional view taken along a line II-II in FIG. 1 that schematically shows the solid-state image sensor 100 according to the first embodiment. Note that FIGS. 1 and 2 show an X axis, a Y axis, and a Z axis as three axes that are orthogonal to each other.

As shown in FIGS. 1 and 2, the solid-state image sensor 100 includes a semiconductor substrate 10, a first impurity region 20, second impurity regions 30, pinning layers 40, a first insulating layer 50, a second insulating layer 52, a third insulating layer 54, a first light shielding layer 60, and a second light shielding layer 70. Note that, in the following description, the first insulating layer 50, the second insulating layer 52, and the third insulating layer 54 may also be referred to as insulating layers 50, 52, and 54, and the first light shielding layer 60 and the second light shielding layer 70 may also be referred to as light shielding layers 60 and 70. In FIG. 1, the pinning layers 40, the insulating layers 50, 52, and 54, and the second light shielding layer 70 are omitted for convenience.

The semiconductor substrate 10 is a semiconductor substrate of a second conductivity type. The second conductivity type refers to n-type. The semiconductor substrate 10 is an n-type silicon substrate obtained by adding an impurity such as phosphorus to silicon. The impurity concentration in the semiconductor substrate 10 is about $5 \times 10^{14}$ atom/cm$^3$, for example. The impurity concentration can be measured using a SIMS (Secondary Ion Mass Spectroscopy).

The first impurity region 20 is disposed on the semiconductor substrate 10. The first impurity region 20 is an impurity region of a first conductivity type, which differs from the second conductivity type. The first conductivity type refers to p-type. The first impurity region 20 is a p-type impurity region obtained by adding an impurity such as boron to silicon. The impurity concentration in the first impurity region 20 is $1 \times 10^{15}$ atom/cm$^3$ or more and $1 \times 10^{16}$ atom/cm$^3$ or less, for example. A ground potential is applied to the first impurity region 20. The ground potential is 0 V, for example.

The second impurity regions 30 are disposed in the first impurity region 20. The depth of the second impurity regions 30 is smaller than the depth of the first impurity region 20. The second impurity regions 30 are n-type impurity regions obtained by adding an impurity such as phosphorus to silicon. The impurity concentration in the second impurity regions 30 is higher than the impurity concentration in the semiconductor substrate 10. The impurity concentration in the second impurity regions 30 is $1 \times 10^{15}$ atom/cm$^3$ or more and $1 \times 10^{17}$ atom/cm$^3$ or less, for example.

A plurality of second impurity regions 30 are disposed. The plurality of second impurity regions 30 are arranged at a predetermined pitch in a first direction. In the shown example, the first direction is an X-axis direction. The first impurity region 20 electrically separates the plurality of second impurity regions 30 from each other. Furthermore, the first impurity region 20 electrically separates the semiconductor substrate 10 and the second impurity regions 30 from each other.

The second impurity regions 30 and portions 21 of the first impurity region 20 that overlap the second impurity regions 30 in a plan view constitute pixels 2. Each of the pixels 2 is constituted by a photodiode. The pixels 2, upon being irradiated with light, generate carriers and accumulate these carriers. Note that "in a plan view" refers to viewing from a thickness direction of the semiconductor substrate 10, and refers to viewing from the Z-axis direction in the shown example.

Amplifier circuits (not shown) are electrically coupled to the second impurity regions 30. A plurality of amplifier circuits are provided corresponding to the plurality of second impurity regions 30. The amplifier circuits read out voltages that correspond to the amounts of carriers accumulated in the pixels 2, amplify the read voltages, and output the amplified read voltages as output signals. A scanner that includes the solid-state image sensor 100 generates an image based on the output signals output for the respective pixels 2 by the amplifier circuits.

The pinning layers 40 are disposed on the surfaces of the second impurity regions 30. The pinning layers 40 are p-type impurity regions obtained by adding an impurity such as boron to silicon. The impurity concentration in the pinning layers 40 is $1\times10^{17}$ atom/cm$^3$ or more and $1\times10^{19}$ atom/cm$^3$ or less, for example. The pinning layers 40 are capable of reducing a dark current caused by carriers generated due to thermal excitation that does not depend on light, in the second impurity regions 30. In the shown example, the shape of the pinning layers 40 is the same as the shape of the second impurity regions 30 in a plan view.

The first insulating layer 50 is disposed on the first impurity region 20 and the pinning layers 40. The first insulating layer 50 is an inter-layer insulating layer. The first insulating layer 50 is a silicon oxide layer.

The first light shielding layer 60 is disposed on the first insulating layer 50. The first light shielding layer 60 overlaps the first impurity region 20 but does not overlap the second impurity regions 30 in a plan view. The first light shielding layer 60 shields the first impurity region 20 from light. The first light shielding layer 60 is an interconnect layer that is electrically coupled to the first impurity region 20. A ground potential is applied to the first light shielding layer 60. The first light shielding layer 60 is an aluminum layer or a copper layer.

The first light shielding layer 60 has second portions 62 that overlap first portions 22 of the first impurity region 20 in a plan view. The first impurity region 20 has the first portions 22 located between adjacent second impurity regions 30. The length W2 of one second portion 62 in the X-axis direction is smaller than the length W1 of one first portion 22 in the X-axis direction. The length W1 is the length of one first portion 22 in the X-axis direction, and is the smallest length between two adjacent second impurity regions 30. The length W2 is the largest length of one second portion 62 in the X-axis direction. In the example shown in FIG. 1, the shape of the first portions 22 and the shape of the second portions 62 are rectangular in a plan view. In a plan view, the center of each first portion 22 overlaps the center of the corresponding second portion 62.

A distance D1 is equal to a distance D2. The first distance D1 is the smallest distance between one of two adjacent second impurity regions 30 and a corresponding second portion 62 in a plan view. The second distance D2 is the smallest distance between the other one of two adjacent second impurity regions 30 and the corresponding second portion 62 in a plan view. The first distance D1 and the second distance D2 are 0.4 μm, for example.

The length W2 of one second portion 62 of the first light shielding layer 60 is smaller than or equal to a distance D3 between two adjacent depletion layers 4 in the X-axis direction. The distance D3 is the smallest distance between two adjacent depletion layers 4 in the X-axis direction. The length W2 may be equal to the distance D3, or may be smaller than the distance D3. The solid-state image sensor 100 includes the depletion layers 4, which are constituted by the second impurity regions 30 and portions of the first impurity region 20. The depletion layers 4 are formed as a result of the second impurity regions 30 and portions of the first impurity region 20 being depleted. As is also shown in FIG. 2, the depletion layers 4 also extend from boundaries A between the first impurity region 20 and the second impurity regions 30 toward the first impurity region 20. When the impurity concentration in the second impurity regions 30 is $1\times10^{15}$ atom/cm$^3$ or more and $1\times10^{17}$ atom/cm$^3$ or less, the depletion layers 4 extend from the boundaries A toward the first impurity region 20 by approximately 0.4 μm.

The first light shielding layer 60 has third portions 64. The third portions 64 are located in a second direction with respect to the second impurity regions 30 in a plan view. The second direction is a direction orthogonal to the first direction, and is the Y-axis direction in the shown example. In the shown example, the third portions 64 are located in the +Y-axis direction and the −Y-axis direction with respect to the second impurity regions 30. In a plan view, the third portions 64 are spaced apart from the second impurity regions 30. In a plan view, the first impurity region 20 is located between the third portions 64 and the second impurity regions 30.

The second insulating layer 52 is disposed on the first insulating layer 50 and the first light shielding layer 60. The second insulating layer 52 is an inter-layer insulating layer. The second insulating layer 52 is a silicon oxide layer.

The second light shielding layer 70 is disposed on the second insulating layer 52. The second light shielding layer 70 overlaps the first impurity region 20, and does not overlap the second impurity regions 30, in a plan view. The second light shielding layer 70 shields the first impurity region 20 from light. The second light shielding layer 70 is another light shielding layer that overlaps the first light shielding layer 60 in a plan view. In the shown example, the shape of the second light shielding layer 70 is the same as the shape of the first light shielding layer 60 in a plan view. The second light shielding layer 70 is an interconnect layer that is electrically coupled to the first impurity region 20. A ground potential is applied to the second light shielding layer 70. The second light shielding layer 70 is an aluminum layer or a copper layer, for example.

The second light shielding layer 70 has fourth portions 72 that overlap the first portions 22 of the first impurity region 20 in a plan view. The length W4 of one fourth portion 72 in the X-axis direction is smaller than the length W1 of one first portion 22 in the X-axis direction. The length W4 is the largest length of one fourth portion 72 in the X-axis direction. In the shown example, the length W4 of one fourth portion 72 is the same as the length W2 of one second portion 62.

The third insulating layer 54 is disposed on the second insulating layer 52 and the second light shielding layer 70. The third insulating layer 54 is a passivation layer. The third insulating layer 54 is a silicon oxide layer or a silicon nitride layer, for example.

1.2. Method for Manufacturing Solid-State Image Sensor

Figure 3:
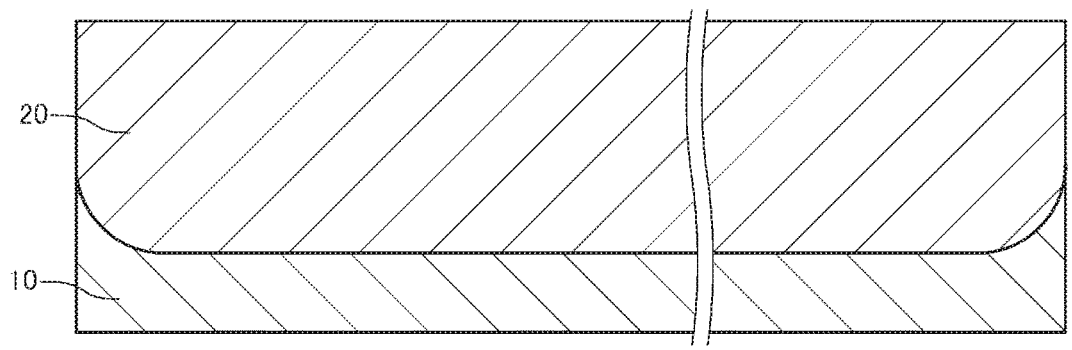
FIG. 3 is a cross-sectional view schematically showing a process of manufacturing the solid-state image sensor according to the first embodiment.

Next, a method for manufacturing the solid-state image sensor 100 according to the first embodiment will be described with reference to the drawings. FIG. 3 is a cross-sectional view schematically showing a process of manufacturing the solid-state image sensor 100 according to the first embodiment.

As shown in FIG. 3, the first impurity region 20 is formed in the semiconductor substrate 10. The first impurity region 20 is formed by injecting boron into the semiconductor substrate 10 using an ion injection method, for example.

As shown in FIG. 2, the second impurity regions 30 are formed in the first impurity region 20. The second impurity regions 30 are formed by injecting phosphorus into the first impurity region 20 using an ion injection method, for example.

Next, the pinning layers 40 are formed in the second impurity regions 30. The pinning layers 40 are formed by injecting boron into the second impurity regions 30 using an ion injection method, for example.

Next, the first insulating layer 50 is formed on the first impurity region 20 and the pinning layers 40. The first insulating layer 50 is formed using a CVD (Chemical Vapor Deposition) method, for example. Next, for example, the upper surface of the first insulating layer 50 is polished and flattened by means of CMP (Chemical Mechanical Polishing), for example.

Next, the first light shielding layer 60 is formed on the first insulating layer 50. The first light shielding layer 60 is formed by means of film deposition using a sputtering method, and patterning by means of photolithography and etching, for example.

Next, the second insulating layer 52 is formed on the first insulating layer 50 and the first light shielding layer 60. The second insulating layer 52 is formed using a CVD method, for example. Next, for example, the upper surface of the second insulating layer 52 is polished and flattened by means of CMP.

Next, the second light shielding layer 70 is formed on the second insulating layer 52. The second light shielding layer 70 is formed by means of film deposition using a sputtering method, and patterning by means of photolithography and etching, for example.

Next, the third insulating layer 54 is formed on the second insulating layer 52 and the second light shielding layer 70. The third insulating layer 54 is formed using a CVD method, for example. Lastly, for example, the upper surface of the third insulating layer 54 may be polished and flattened by means of CMP.

The solid-state image sensor 100 can be manufactured through the above process.

1.3. Effects

The solid-state image sensor 100 has the following effects, for example.

Figure 4:
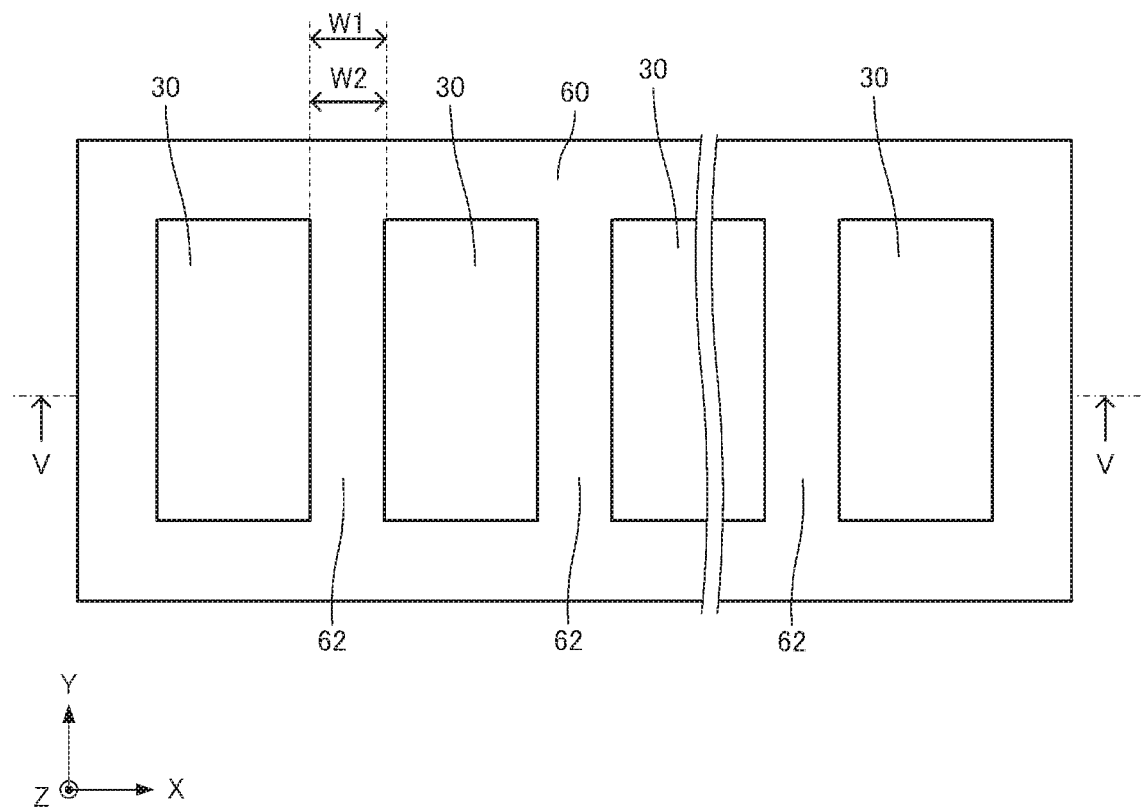
FIG. 4 is a plan view schematically showing a solid-state image sensor in which the width of a first portion of a first impurity region is equal to the width of a second portion of a light shielding layer.
Figure 5:
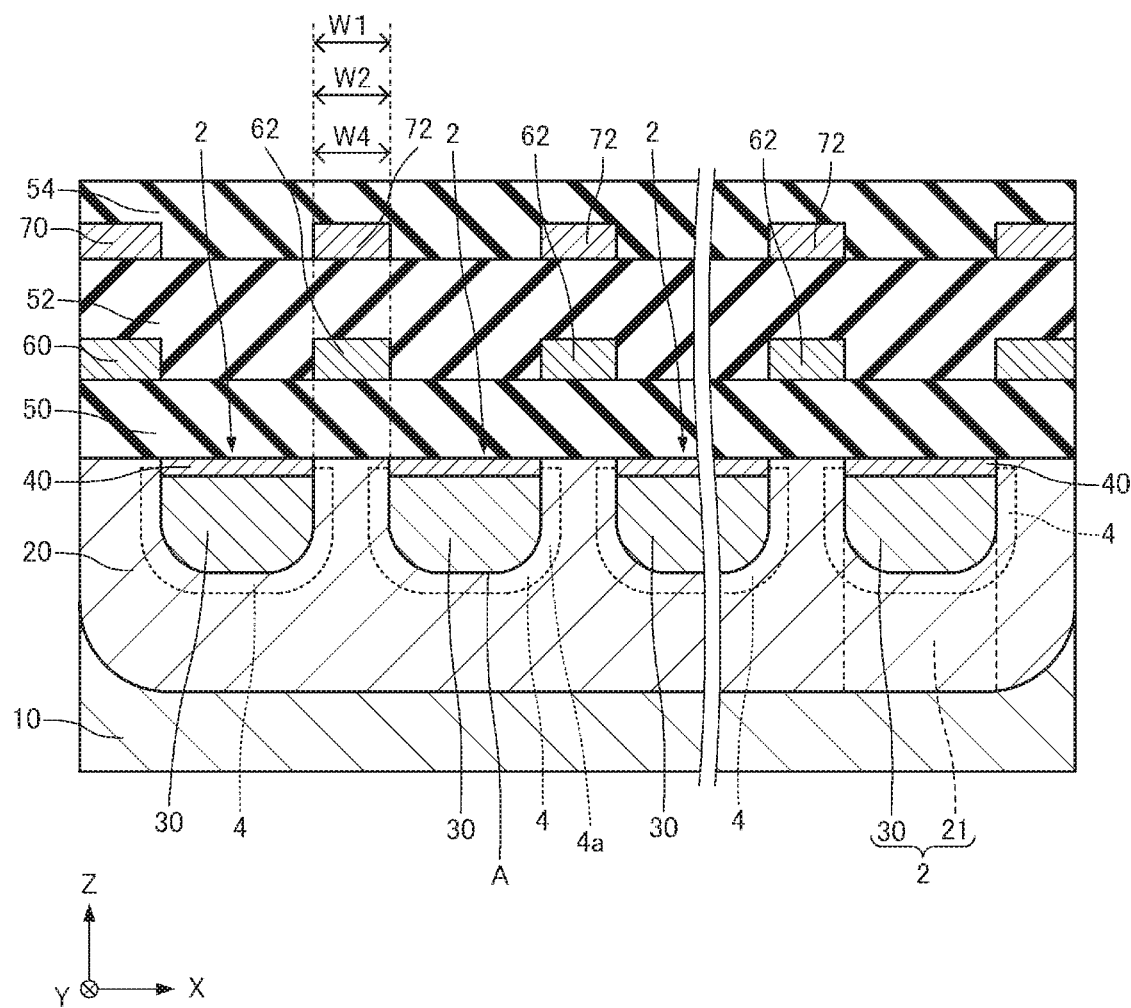
FIG. 5 is a cross-sectional view schematically showing a solid-state image sensor in which the width of the first portion of the first impurity region is equal to the width of the second portion of the first light shielding layer.

In the solid-state image sensor 100, the length W2 of one second portion 62 of the first light shielding layer 60 in the X-axis direction is smaller than the length W1 of one first portion 22 of the first impurity region 20 in the X-axis direction. Thus, in the solid-state image sensor 100, portions 4a of the depletion layers 4 that are constituted by the first impurity region 20 are also irradiated with light. Accordingly, the amount of carriers accumulated in the depletion layers 4 can be increased compared with the case where the length W2 is the same as the length W1 as shown in FIGS. 4 and 5. This configuration enables the solid-state image sensor 100 to be highly sensitive. Accordingly, when the solid-state image sensor 100 is used in a scanner, the exposure time of the scanner can be shortened, and an increase in speed is achieved.

Note that FIG. 4 is a plan view schematically showing a solid-state image sensor in which the length W2 is equal to the length W1. FIG. 5 is a cross-sectional view taken along a line V-V in FIG. 4 that schematically shows the solid-state image sensor in which the length W2 is equal to the length W1. In FIG. 4, the pinning layers 40, the insulating layers 50, 52, and 54, and the second light shielding layer 70 are omitted for convenience.

Furthermore, the first light shielding layer 60 has the second portions 62 that overlap the first portions 22 in a plan view. Thus, adjacent second impurity regions 30 can be electrically separated from each other more reliably than in the case where the second portions are not provided. Accordingly, when the solid-state image sensor 100 is used in a scanner, the likelihood that crosstalk occurs, i.e. a color looks blurred in a scanned image can be reduced.

In the solid-state image sensor 100, the first light shielding layer 60 is an interconnect layer that is electrically coupled to the first impurity region 20. Thus, the structure of the solid-state image sensor 100 can be simplified compared with the case where a light shielding layer is provided separately from an interconnect layer.

In the solid-state image sensor 100, a ground potential is applied to the first light shielding layer 60. Accordingly, in the solid-state image sensor 100, parasitic capacitance can be reduced compared with the case where a potential higher than the ground potential is applied to the first light shielding layer 60.

In the solid-state image sensor 100, in a plan view, the first distance D1 between one of two adjacent second impurity regions 30 and a corresponding second portion 62 is equal to the second distance D2 from the other one of the two adjacent second impurity regions 30 and the corresponding second portion 62. Thus, in the solid-state image sensor 100, the difference in the amount of accumulated carriers between a depletion layer 4 that has the one of the second impurity regions 30 and a depletion layer 4 that has the other one of the second impurity regions 30 can be reduced compared with the case where the first distance D1 differs from the second distance D2. Accordingly, the difference in sensitivity between a pixel 2 that has the one of the second impurity regions 30 and a pixel 2 that has the other one of the second impurity regions 30 can be reduced.

In the solid-state image sensor 100, the impurity concentration in the second impurity regions 30 is $1 \times 10^{15}$ atom/cm$^3$ or more and $1 \times 10^{17}$ atom/cm$^3$ or less, and the first distance D1 and the second distance D2 are 0.4 μm. When the impurity concentration in the second impurity regions 30 is $1 \times 10^{15}$ atom/cm$^3$ or more and $1 \times 10^{17}$ atom/cm$^3$ or less, the depletion layers 4 extend from the boundaries A toward the first impurity region 20 by approximately 0.4 μm. Thus, in the solid-state image sensor 100, the portions 4a of the depletion layers 4 are more reliably irradiated with light.

In the solid-state image sensor 100, the length W2 of one second portion 62 in the X-axis direction is smaller than or equal to the distance D3 between two adjacent depletion layers 4 in the X-axis direction. Thus, in the solid-state image sensor 100, the portions 4a of the depletion layers 4 are more reliably irradiated with light.

In the solid-state image sensor 100, the third portions 64 of the first light shielding layer 60 are located in the Y-axis direction with respect to the second impurity regions 30 in a plan view, and the third portions 64 are spaced apart from the second impurity regions 30 in a plan view. Thus, in the solid-state image sensor 100, the depletion layers 4, which are located in the Y-axis direction with respect to the second impurity regions 30 in a plan view, are irradiated with light.

In the solid-state image sensor 100, the second light shielding layer 70 has fourth portions 72 that overlap the first portions 22 of the first impurity region 20 in a plan view, and the length W4 of one fourth portion 72 in the X-axis direction is smaller than the length W1 of one first portion 22 in the X-axis direction. Thus, in the solid-state image sensor 100, the amount of carriers accumulated in the depletion layers 4 can be increased as in the first light shielding layer 60, compared with the case where the length W4 is the same as the length W1.

In the solid-state image sensor 100, the first light shielding layer 60 has the second portions 62 as mentioned above. For this reason, when the second insulating layer 52 is polished by means of CMP, dishing is unlikely to occur, i.e. the second insulating layer 52 is unlikely to be excessively polished.

Figure 6:
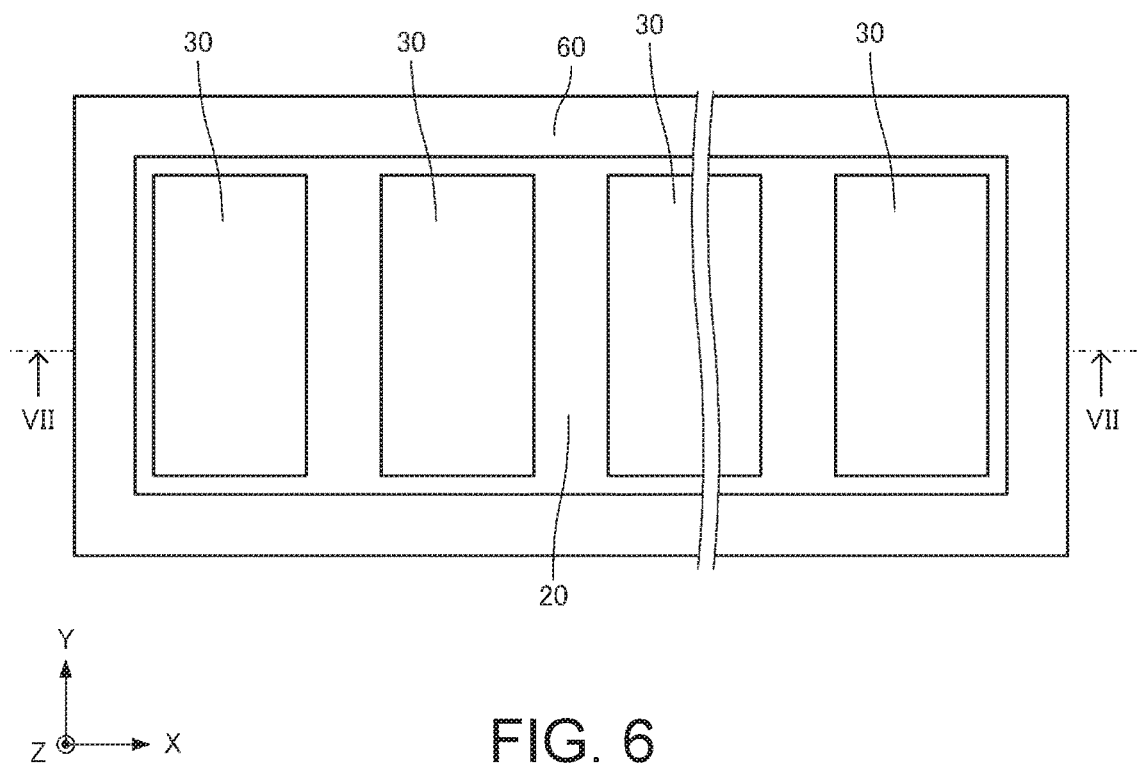
FIG. 6 is a plan view schematically showing a solid-state image sensor in which dishing may occur.
Figure 7:
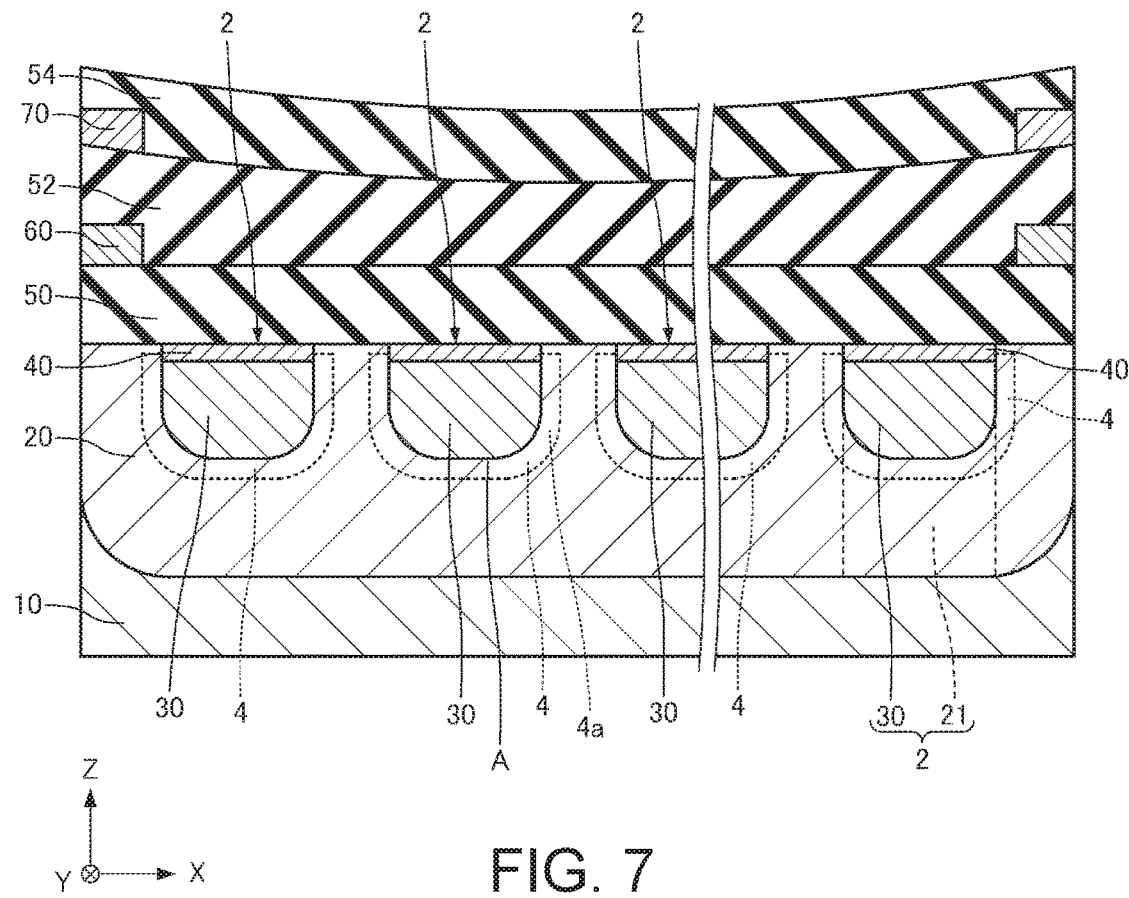
FIG. 7 is a cross-sectional view schematically showing the solid-state image sensor in which dishing may occur.

If the first light shielding layer 60 does not have the second portions 62 as shown in FIGS. 6 and 7, dishing may occur, i.e. the second insulating layer 52 may be excessively polished at portions where the density of the first light shielding layer 60 is small, when the second light shielding layer 52 is polished by means of CMP. Consequently, when patterning is performed to form the second light shielding layer 70, there may be cases where focusing fails during lithography and a defect occurs in the second light shielding layer 70.

Note that FIG. 6 is a plan view schematically showing a solid-state image sensor in which dishing may occur. FIG. 7 is a cross-sectional view taken along a line VII-VII in FIG. 6 that schematically shows the solid-state image sensor in which dishing may occur. In FIG. 6, the pinning layers 40, the insulating layers 50, 52, and 54, and the second light blocking layer 70 are omitted for convenience.

Note that, in the above-described example, three insulating layers and two light shielding layers are included, but the number of insulating layers and the number of light shielding layers are not specifically limited. Although not shown in the diagrams, the solid-state image sensor 100 may alternatively include four insulating layers and three light shielding layers.

In the above-described example, the first conductivity type is p-type and the second conductivity type is n-type, but the first conductivity type may be n-type, and the second conductivity type may be p-type. That is to say, the semiconductor substrate 10 and the second impurity regions 30 may be of a p-type, and the first impurity region 20 and the pinning layers 40 may be of an n-type.

The solid-state image sensor 100 may be a CCD (Charge Coupled Device), or may be a CMOS (Complementary Metal Oxide Semiconductor) image sensor.

1.4. Modifications 1.4.1. First Modification

Figure 8:
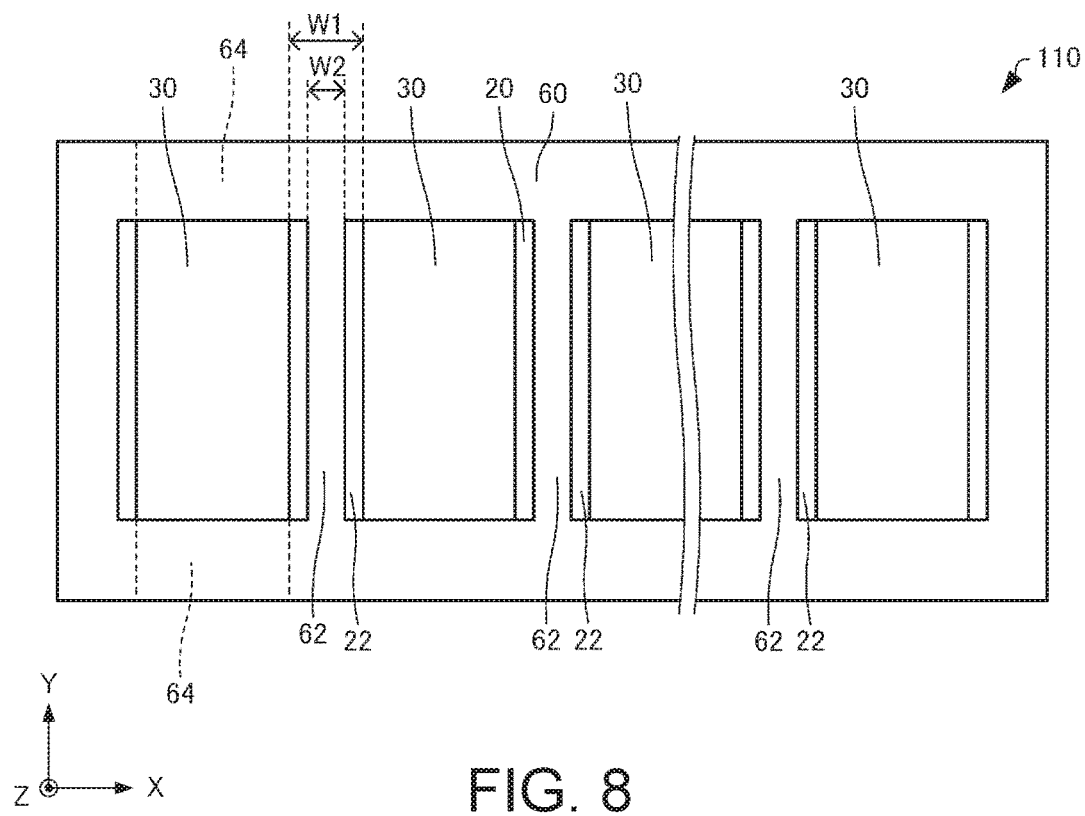
FIG. 8 is a plan view schematically showing a solid-state image sensor according to a first modification of the first embodiment.

Next, a solid-state image sensor 110 according to a first modification of the first embodiment will be described with reference to the drawings. FIG. 8 is a plan view schematically showing the solid-state image sensor 110 according to the first modification of the first embodiment. Note that, in FIG. 8, the pinning layers 40, the insulating layers 50, 52, and 54, and the second light shielding layer 70 are omitted for convenience.

In the following description of the solid-state image sensor 110 according to the first modification of the first embodiment, members with the same functions as those of the constituent members of the solid-state image sensor 100 according to the above-described first embodiment are assigned the same reference numerals, and detailed description thereof is omitted. This also applies to a later-described solid-state image sensor according to a second modification of the first embodiment.

In the above-described solid-state image sensor 100, in a plan view, the third portions 64 of the first light shielding layer 60 are spaced apart from the second impurity regions 30, and the first impurity region 20 is located between the third portions 64 and the second impurity regions 30, as shown in FIG. 1.

In contrast, in the solid-state image sensor 110, the first impurity region 20 is not located between the third portions 64 of the first light shielding layer 60 and the second impurity regions 30, as shown in FIG. 8. In the solid-state image sensor 110, the third portions 64 overlap the depletion layers 4 that are located in the Y-axis direction with respect to the second impurity regions 30 in a plan view.

In the solid-state image sensor 110, the length W2 of one second portion 62 of the first light shielding layer 60 in the X-axis direction is smaller than the length W1 of one first portion 22 of the first impurity region 20 in the X-axis. Accordingly, the amount of carriers accumulated in the depletion layers 4 can be increased, as with the solid-state image sensor 100, compared with the case where the length W2 is the same as the length W1. As shown in FIG. 8, the length of one second impurity region 30 in the Y-axis direction is greater than the length in the X-axis direction. Thus, if the length W2 is smaller than the length W1, the solid-state image sensor 110 can be configured to be highly sensitive even if the third portions 64 overlap the depletion layers 4.

1.4.2. Second Modification

Figure 9:
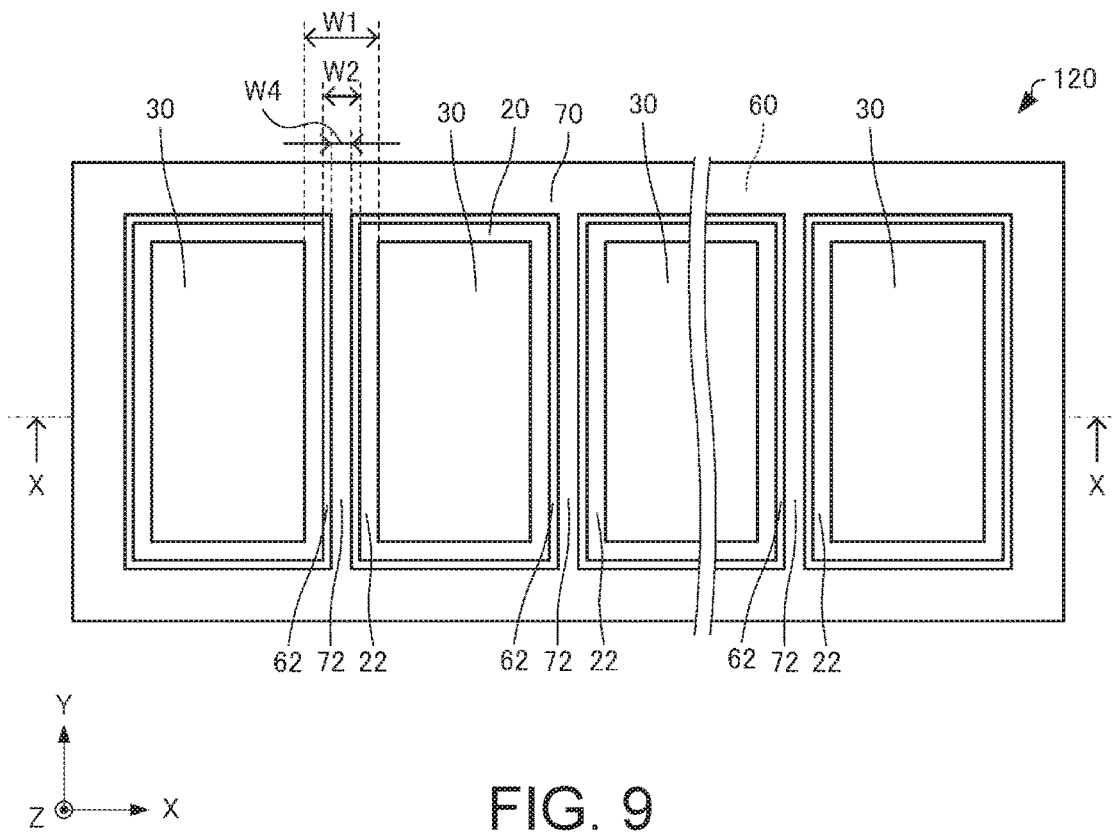
FIG. 9 is a plan view schematically showing a solid-state image sensor according to a second modification of the first embodiment.
Figure 10:
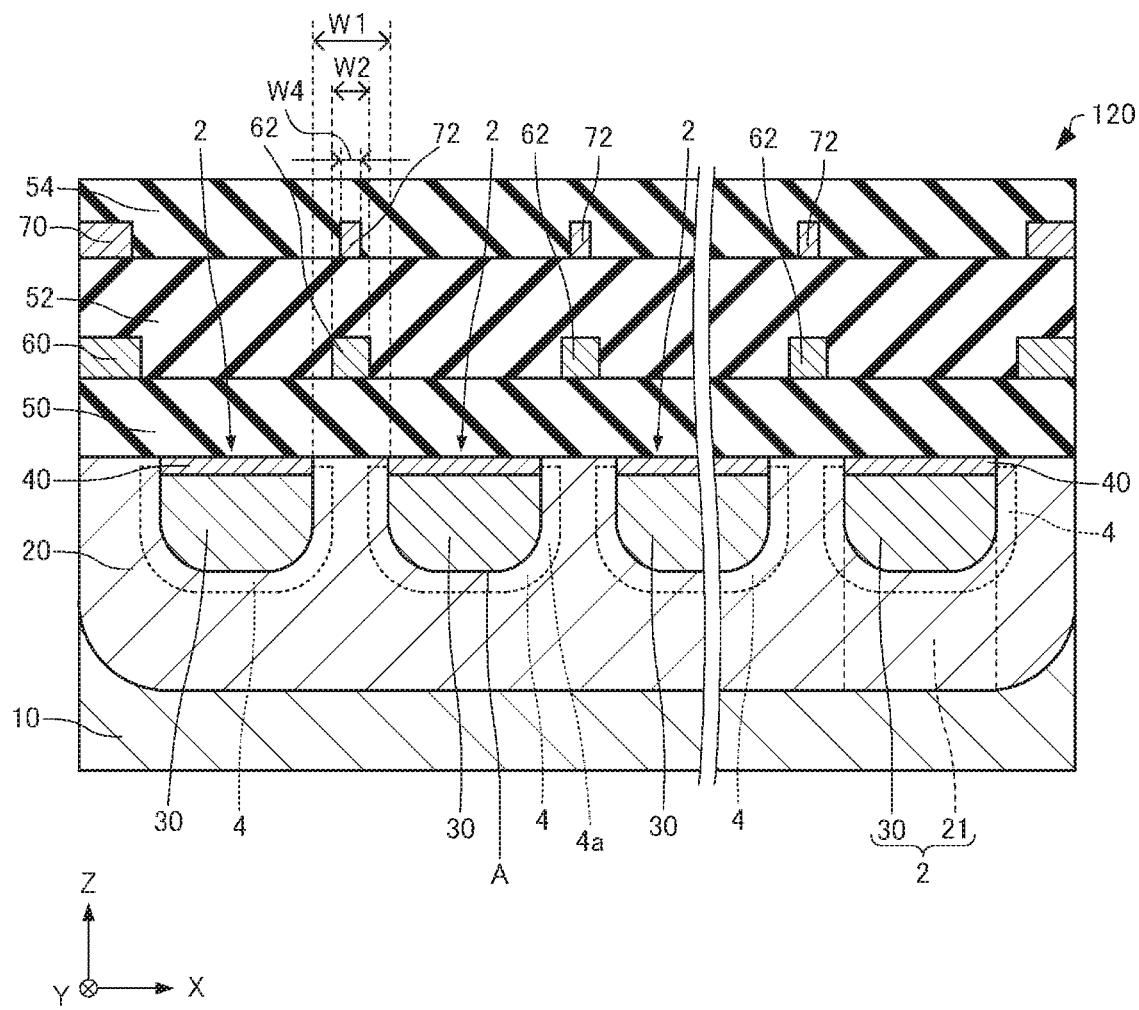
FIG. 10 is a cross-sectional view schematically showing a solid-state image sensor according to the second modification of the first embodiment.

Next, a solid-state image sensor 120 according to the second modification of the first embodiment will be described with reference to the drawings. FIG. 9 is a plan view schematically showing the solid-state image sensor 120 according to the second modification of the first embodiment. FIG. 10 is a cross-sectional view taken along a line X-X in FIG. 9 that schematically shows the solid-state image sensor 120 according to the second modification of the first embodiment. Note that, in FIG. 9, the pinning layers 40 and the insulating layers 50, 52, and 54 are omitted for convenience.

In the above-described solid-state image sensor 100, the length W2 of one second portion 62 of the first light shielding layer 60 in the X-axis direction is equal to the length W4 of one fourth portion 72 of the second light shielding layer 70 in the X-axis direction, as shown in FIG. 2.

In contrast, in the solid-state image sensor 120, the length W4 of one fourth portion 72 of the second light shielding layer 70 is smaller than the length W2 of one second portion 62 of the first light shielding layer 60, as shown in FIGS. 9 and 10. Thus, in the solid-state image sensor 120, light incident on the solid-state image sensor 120 obliquely relative to the Z axis is unlikely to be blocked by the fourth portions 72, compared with the case where the length W2 is the same as the length W4. This configuration can increase the amount of light incident on the pixels 2, and can increase sensitivity.

2. Second Embodiment 2.1. Solid-State Image Sensor

Figure 11:
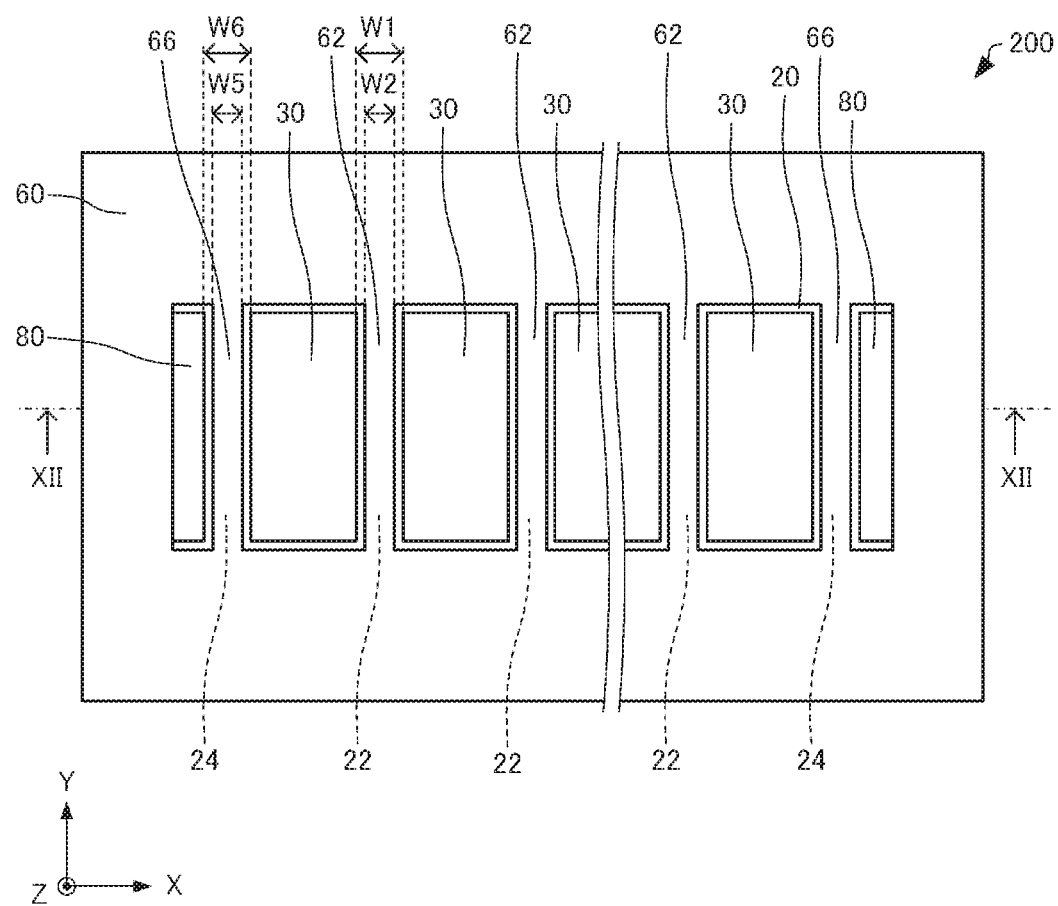
FIG. 11 is a plan view schematically showing a solid-state image sensor according to a second embodiment.
Figure 12:
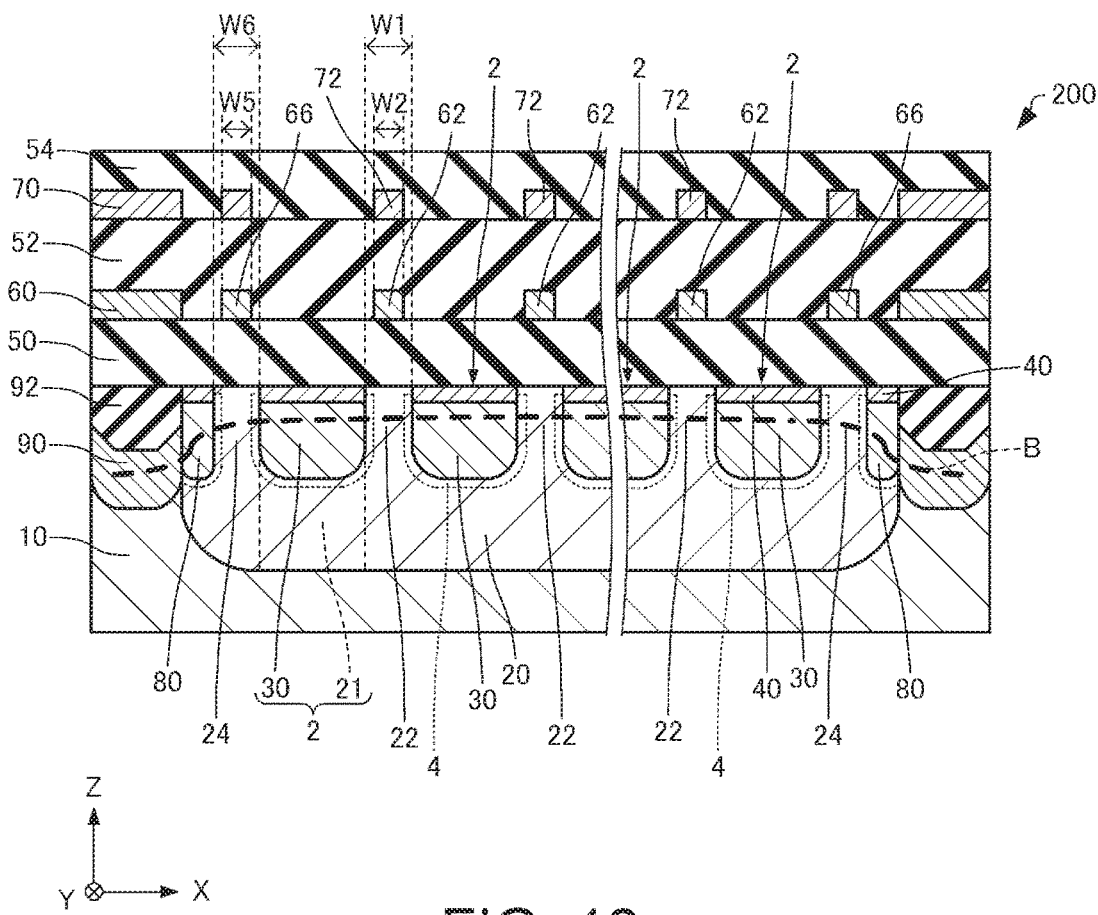
FIG. 12 is a cross-sectional view schematically showing the solid-state image sensor according to the second embodiment.

Next, a solid-state image sensor 200 according to the second embodiment will be described with reference to the drawings. FIG. 11 is a plan view schematically showing the solid-state image sensor 200 according to the second embodiment. FIG. 12 is a cross-sectional view taken along a line XII-XII in FIG. 11 that schematically shows the solid-state image sensor 200 according to the second embodiment. Note that, in FIG. 11, the pinning layers 40, the insulating layers 50, 52, and 54, and the second light shielding layer 70 are omitted for convenience.

In the following description of the solid-state image sensor 200 according to the second embodiment, members with the same functions as those of the constituent members of the solid-state image sensor 100 according to the above-described first embodiment are assigned the same reference numerals, and detailed description thereof is omitted.

The solid-state image sensor 200 differs from the above-described solid-state image sensor 100 in that the solid-state image sensor 200 includes third impurity regions 80, as shown in FIGS. 11 and 12. Furthermore, the solid-state image sensor 200 includes a fourth impurity region 90 and a LOCOS (Local Oxidation of Silicon) layer 92.

The third impurity regions 80 are disposed in the first impurity region 20. The depth of the third impurity regions 80 is smaller than the depth of the first impurity region 20. In the shown example, the depth of the third impurity regions 80 is the same as the depth of the second impurity regions 30. The plurality of second impurity regions 30 and the third impurity regions 80 are arranged in the X-axis direction. Of the plurality of second impurity regions 30 and the third impurity regions 80 that are arranged in the X-axis direction, the third impurity regions 80 are located at the ends. In the shown example, the third impurity regions 80 are disposed at one end and the other end, in the X-axis direction, of a line in which the second impurity regions 30 and the third impurity regions 80 are arranged.

The third impurity regions 80 do not constitute the pixels 2. Thus, the amplifier circuits (not shown) are not electrically coupled to the third impurity regions 80. Note that the first impurity region 20 need not be provided in the Y-axis direction of the third impurity regions 80 in a plan view.

The third impurity regions 80 are spaced apart from the second impurity regions 30. The first impurity region 20 has portions 24 between the third impurity regions 80 and the second impurity regions 30 adjacent to the third impurity regions 80. The length of one third impurity region 80 in the X-axis direction is smaller than the length of one second impurity region 30 in the X-axis direction.

The first light shielding layer 60 has portions 66 that overlap the portions 24 of the first impurity region 20 in a plan view. The length W5 of one portion 66 in the X-axis direction is smaller than the length W6 of one portion 24 in the X-axis direction. The length W5 is equal to the length W2. The length W6 is equal to the length W1.

The third impurity regions 80 are n-type impurity regions obtained by adding an impurity such as phosphorus to silicon. The impurity concentration in the third impurity regions 80 is greater than or equal to the impurity concentration in the second impurity regions 30, and is smaller than the impurity concentration in the fourth impurity region 90. The third impurity regions 80 are coupled to the fourth impurity region 90. The pinning layers 40 are disposed on the surfaces of the third impurity regions 80.

The fourth impurity region 90 is disposed on the semiconductor substrate 10. The fourth impurity region 90 surrounds the first impurity region 20 in a plan view. The fourth impurity region 90 surrounds the second impurity regions 30 and the third impurity regions 80 in a plan view. In the shown example, the depth of the fourth impurity region 90 is smaller than the depth of the first impurity region 20.

The fourth impurity region 90 is an n-type impurity region obtained by adding an impurity such as phosphorus to silicon. The fourth impurity region 90 is a high-concentration impurity region with an impurity concentration higher than the impurity concentration in the second impurity regions 30. The impurity concentration in the fourth impurity region 90 is $1 \times 10^{16}$ atom/cm$^3$ or more and $1 \times 10^{17}$ atom/cm$^3$ or less, for example.

A power supply voltage VDD is applied to the fourth impurity region 90. The power supply voltage VDD is 3.3 V, for example.

The LOCOS layer 92 is disposed on the fourth impurity region 90. The LOCOS layer 92 is an element isolation insulating layer. Note that, although not shown in the diagrams, a semi-recessed LOCOS layer or an STI (shallow trench isolation) layer may be used in place of the LOCOS layer 92.

2.2. Method for Manufacturing Solid-State Image Sensor

Next, a method for manufacturing the solid-state image sensor 200 according to the second embodiment will be described with reference to the drawings.

As shown in FIG. 12, the LOCOS layer 92 is formed on the semiconductor substrate 10. The LOCOS layer 92 is formed using a LOCOS method.

Next, the first impurity region 20 is formed on the semiconductor substrate 10. The first impurity region 20 is formed by injecting boron into the semiconductor substrate 10 using an ion injection method, for example.

Next, the second impurity regions 30 and the third impurity regions 80 are formed on the first impurity region 20. The second impurity regions 30 and the third impurity regions 80 are formed by injecting phosphorus into the first impurity region 20 using an ion injection method, for example. In the following description, the second impurity regions 30 and the third impurity regions 80 are also referred to as impurity regions 30 and 80.

Next, the fourth impurity region 90 is formed on the semiconductor substrate 10. The fourth impurity region 90 is formed by injecting phosphorus into the semiconductor substrate 10 using an ion injection method, for example.

Next, the pinning layers 40 are formed on the second impurity regions 30 and the third impurity regions 80. The pinning layers 40 are formed by injecting boron into the impurity regions 30 and 80 using an ion injection method, for example.

The solid-state image sensor 200 can be manufactured through the above process.

Note that the order of the process of forming the impurity regions 30 and 80 and the process of forming the fourth impurity region 90 is not specifically limited. Also, the order of the process of forming the fourth impurity region 90 and the process of forming the pinning layers 40 is not specifically limited.

2.3. Effects

The solid-state image sensor 200 has the following effects, for example.

In the solid-state image sensor 200, the difference in the amount of accumulated carriers between the pixels 2 located at the ends and the pixels 2 that are not located at the ends, of the plurality of pixels 2 arranged in the X-axis direction, can be reduced. The reason will be described below.

Figure 13:
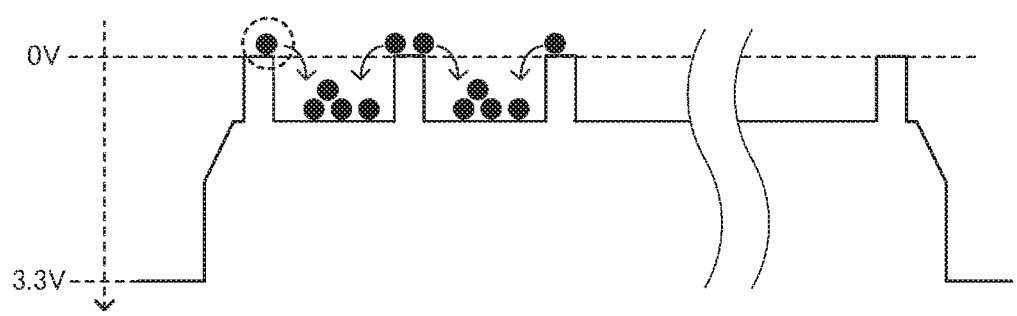
FIG. 13 is a potential energy diagram.
Figure 14:
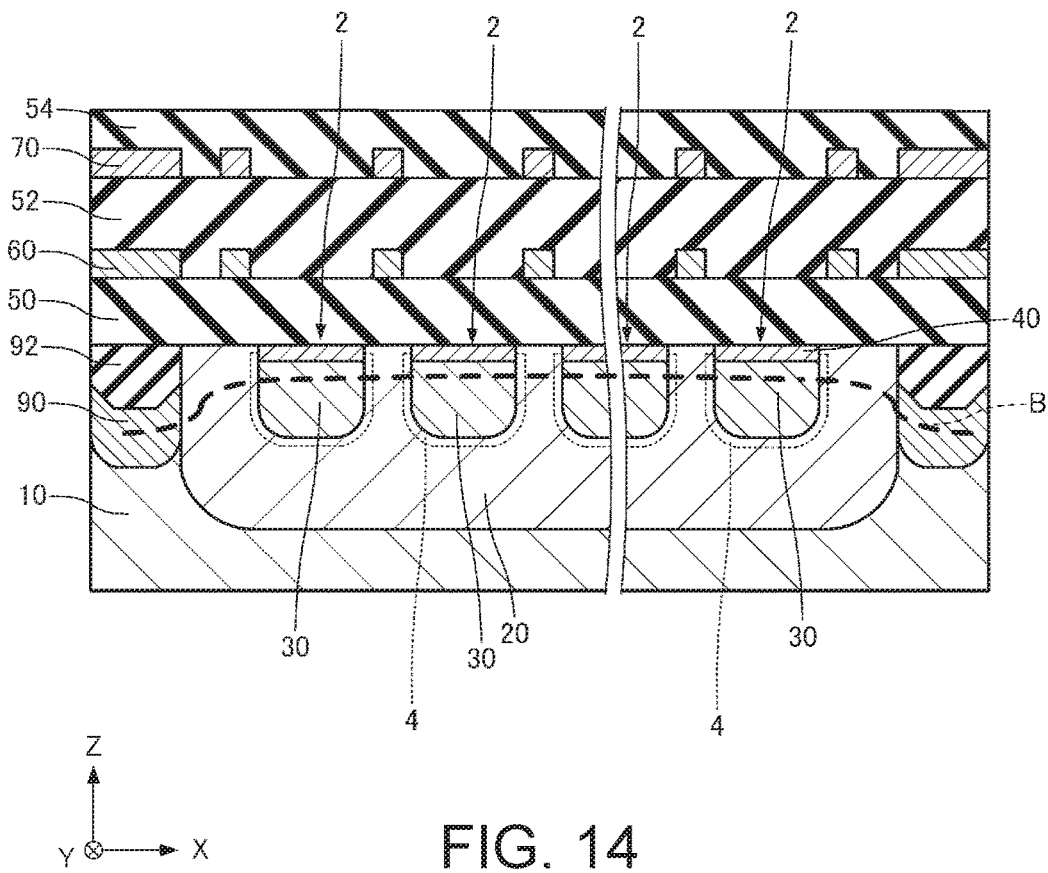
FIG. 14 is a cross-sectional view schematically showing a solid-state image sensor that does not have third impurity regions.
Figure 15:
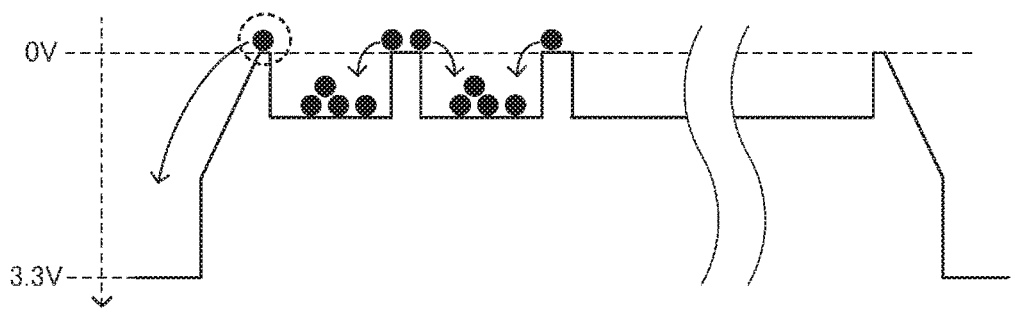
FIG. 15 is a potential energy diagram.

FIG. 13 is a diagram showing potential energy on a broken line B shown in FIG. 12. FIG. 14 is a cross-sectional view schematically showing a solid-state image sensor that does not have the third impurity regions 80. FIG. 15 is a diagram showing potential energy on a broken line B shown in FIG. 14. Note that, in FIGS. 13 and 15, carriers are indicated by black dots.

As shown in FIG. 14, if the third impurity regions 80 are not disposed, the potential energy in the first impurity region 20 adjacent to the fourth impurity region 90 is affected by the 3.3 V applied to the fourth impurity region 90 and decreases, as shown in FIG. 15. For this reason, it is highly probable that carriers generated in the first impurity region 20 between the pixels 2 located at the ends and the fourth impurity region 90, namely carriers surrounded by the broken line, will fall down into the fourth impurity region 90, rather than the pixels 2 located at the ends. Consequently, the amount of carriers accumulated in the pixels 2 located at the ends is smaller than the amount of carriers accumulated in pixels 2 that are not located at the ends. As a result, the pixels 2 located at the ends are less sensitive.

In contrast, in the solid-state image sensor 200, the third impurity regions 80 can make the potential energy at the portions 24 between the second impurity regions 30 and the third impurity regions 80 the same as the potential energy at the first portions 22 between two adjacent second impurity regions 30, as shown in FIG. 13. Thus, the probability that carriers generated at the portions 24, namely carriers surrounded by the broken line, will fall down into the pixels 2 can be approximated to the probability that carriers generated at the first portions 22 will fall down into the pixels 2. Thus, the difference in the amount of accumulated carriers between the pixels 2 located at the ends and the pixels 2 that are not located at the ends can be reduced. As a result, the pixels 2 located at the ends are unlikely to become less sensitive, and the difference in sensitivity between the pixels 2 located at the ends and the pixels 2 that are not located at the ends can be reduced.

The phenomenon in which the sensitivity deteriorates is particularly an issue in CISs for high-resolution use in which the pitch between the pixels 2 is 10 μm or less, for example. This is because, the smaller the pitch between the pixels 2 is, the smaller the area of each pixel 2 is and the smaller the amount of accumulated carriers is, and thus, the amount of carriers that move from the pixels 2 located at the ends to the fourth impurity region 90 is not negligible with respect to the amount of carriers accumulated in the pixels 2 that are not located at the ends.

As mentioned above, in the solid-state image sensor 200, the third impurity regions 80 function as electric-field relaxing regions that relax the voltage applied to the fourth impurity region 90, and thus the sensitivity of the pixels 2 located at the ends is unlikely to deteriorate.

Furthermore, in the solid-state image sensor 200, the length W5 of one portion 66 of the first light shielding layer 60 in the X-axis direction is smaller than the length W6 of one portion 24 of the first impurity region 20 in the X-axis direction. Thus, it is possible to reduce the likelihood that the depletion layers 4 that have the second impurity regions 30 that constitute the pixels 2 located at the ends are shielded from light by the portions 66 of the first light shielding layer 60. Accordingly, the difference in sensitivity between the pixels 2 located at the ends and the pixels 2 that are not located at the ends can be reduced.

2.4. Modifications

Next, a solid-state image sensor according to a modification of the second embodiment will be described with reference to the drawings.

In the following description, differences between the solid-state image sensor according to the modification of the second embodiment and the example of the solid-state image sensor 200 according to the above-described second embodiment will be described, and description of the same points will be omitted.

In the above-described solid-state image sensor 200, the conductivity type of the semiconductor substrate 10 and the fourth impurity region 90 is the second conductivity type, namely an n-type.

In contrast, in the solid-state image sensor according to the modification of the second embodiment, the conductivity type of the semiconductor substrate 10 and the fourth impurity region 90 is the first conductivity type, namely a p-type.

In the solid-state image sensor according to the modification of the second embodiment, the impurity concentration in the first impurity region 20 is higher than the impurity concentration in the semiconductor substrate 10. The fourth impurity region 90 is a high-concentration impurity region with an impurity concentration higher than the impurity concentration in the first impurity region 20. A ground potential is applied to the first impurity region 20 and the fourth impurity region 90.

In the solid-state image sensor according to the modification of the second embodiment, it is possible to reduce the difference in the amount of accumulated carriers between the pixels 2 located at the ends and the pixels 2 that are not located at the ends, of the plurality of pixels 2 arranged in the X-axis direction. The reason will be described below.

Figure 16:
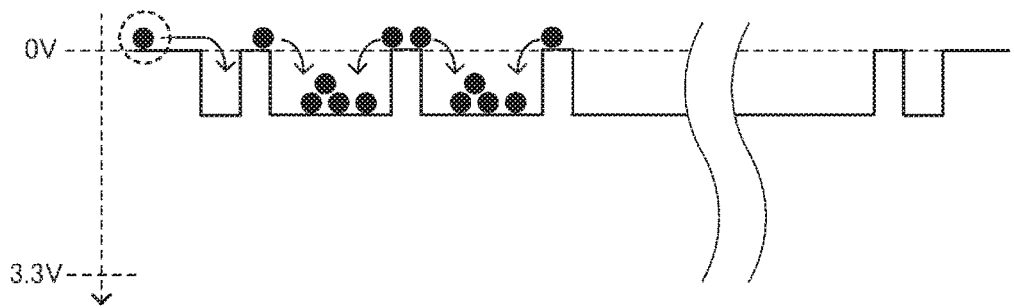
FIG. 16 is a potential energy diagram.
Figure 17:
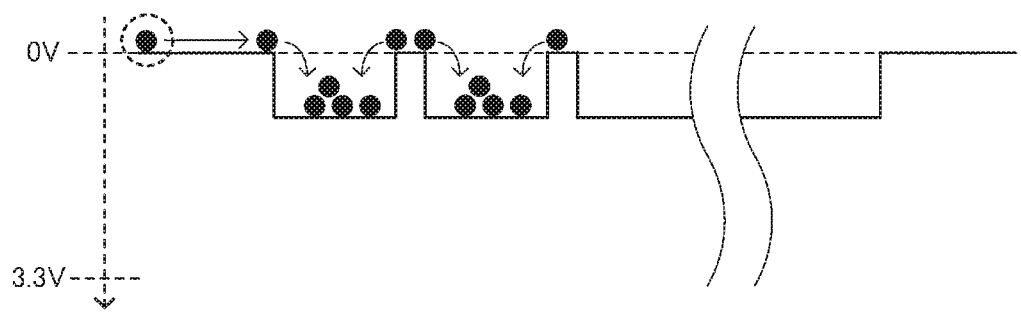
FIG. 17 is a potential energy diagram.

FIG. 16 is a diagram showing potential energy in the solid-state image sensor according to the modification of the second embodiment. Specifically, FIG. 16 is a diagram showing potential energy on the broken line B in the solid-state image sensor 200 shown in FIG. 12 when the conductivity type of the semiconductor substrate 10 and the fourth impurity region 90 is of the p-type. FIG. 17 is a diagram showing potential energy on the broken line B in the solid-state image sensor that does not have the third impurity regions 80 shown in FIG. 14 when the conductivity type of the semiconductor substrate 10 and the fourth impurity region 90 is of the p-type.

If the third impurity regions 80 are not provided, as shown in FIG. 17, carriers generated in the fourth impurity region 90, namely carriers surrounded by the broken line, are likely to gather in the pixels 2 located at the ends, and the amount of accumulated carriers differs between the pixels 2 located at the ends and the pixels 2 that are not located at the ends. As a result, the pixels 2 located at the ends are more sensitive, and a difference in sensitivity occurs between the pixels 2 located at the ends and the pixels 2 that are not located at the ends. In the shown example, the curve indicating the potential energy in the fourth impurity region 90 and the first impurity region 20 is flat for convenience. However, the impurity concentration in the fourth impurity region 90 is higher than the impurity concentration in the first impurity region 20, and thus, in reality, the curve indicating potential energy inclines so as to move down from the fourth impurity region 90 toward the first impurity region 20. Accordingly, carriers generated in the fourth impurity region 90 are likely to gather in the pixels 2 located at the ends.

In contrast, the solid-state image sensor according to the modification of the second embodiment has the third impurity regions 80, and thus, carriers generated in the fourth impurity region 90 gather in the third impurity regions 80, rather than the pixels 2 located at the ends, as shown in FIG. 16. Thus, the difference in the amount of accumulated carriers between the pixels 2 located at the ends and the pixels 2 that are not located at the ends can be reduced. As a result, the pixels 2 located at the ends are unlikely to become less sensitive, and the difference in sensitivity between the pixels 2 located at the ends and the pixels 2 that are not located at the ends can be reduced.

3. Third Embodiment

Figure 18:
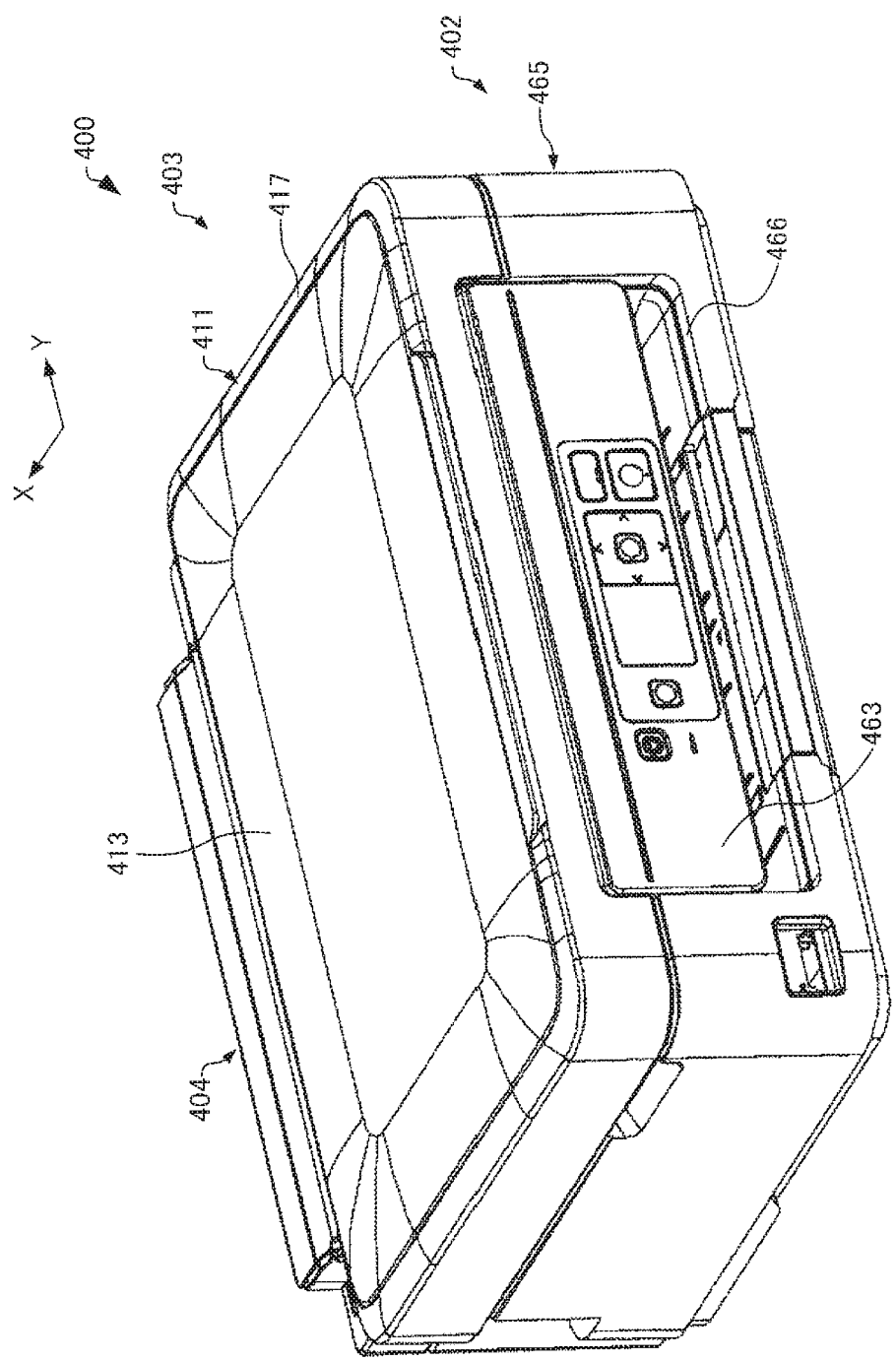
FIG. 18 is a perspective view schematically showing an appearance of a multifunction machine according to a fourth embodiment.

Next, a multifunction machine 400 according to the third embodiment will be described with reference to the drawings. FIG. 18 is a perspective view schematically showing an appearance of the multifunction machine 400 according to the fourth embodiment.

As shown in FIG. 18, the multifunction machine 400 includes a printer unit 402, which is an image recording device, and a scanner unit 403, which is an image reading device. Specifically, the multifunction machine 400 integrally includes the printer unit 402, which is a machine body, and the scanner unit 403, which is an upper unit provided at an upper portion of the printer unit 402. Note that, in the following description, the front-rear direction in FIG. 18 is referred to as an X-axis direction, and the left-right direction is referred to as a Y-axis direction.

As shown in FIG. 18, the printer unit 402 includes a conveyance portion (not shown) that feeds a sheet-type recording medium, namely print paper or cut paper, along a feeding path, a print portion (not shown) that is provided above the feeding path and performs print processing on the recording media using an inkjet method, a panel-form operation portion 463 provided in the front surface, a machine frame (not shown) on which the conveyance portion, the print portion, and the operation portion 463 are mounted, and a machine housing 465 that covers these members. The machine housing 465 is provided with a discharge port 466 from which a printed recording medium is discharged. Although not shown in the diagram, a USB (Universal Serial Bus) port and a power supply port are provided at a lower portion of the back surface. That is to say, the multifunction machine 400 can be connected to a computer or the like via the USB port.

The scanner unit 403 is pivotably supported by the printer unit 402 via a hinge portion 404 at a rear end portion, and covers an upper portion of the printer unit 402 in an openable and closable manner. That is to say, by pulling up the scanner unit 403 in a pivoting direction, an upper opening portion of the printer unit 402 is exposed, and the interior of the printer unit 402 is exposed via the upper opening portion. Conversely, the upper opening portion is closed with the scanner unit 403 by pulling down the scanner unit 403 in the pivoting direction and placing the scanner unit 403 on the printer unit 402. Thus, for example, ink cartridges can be replaced and a paper jam can be resolved by opening the scanner unit 403.

Figure 19:
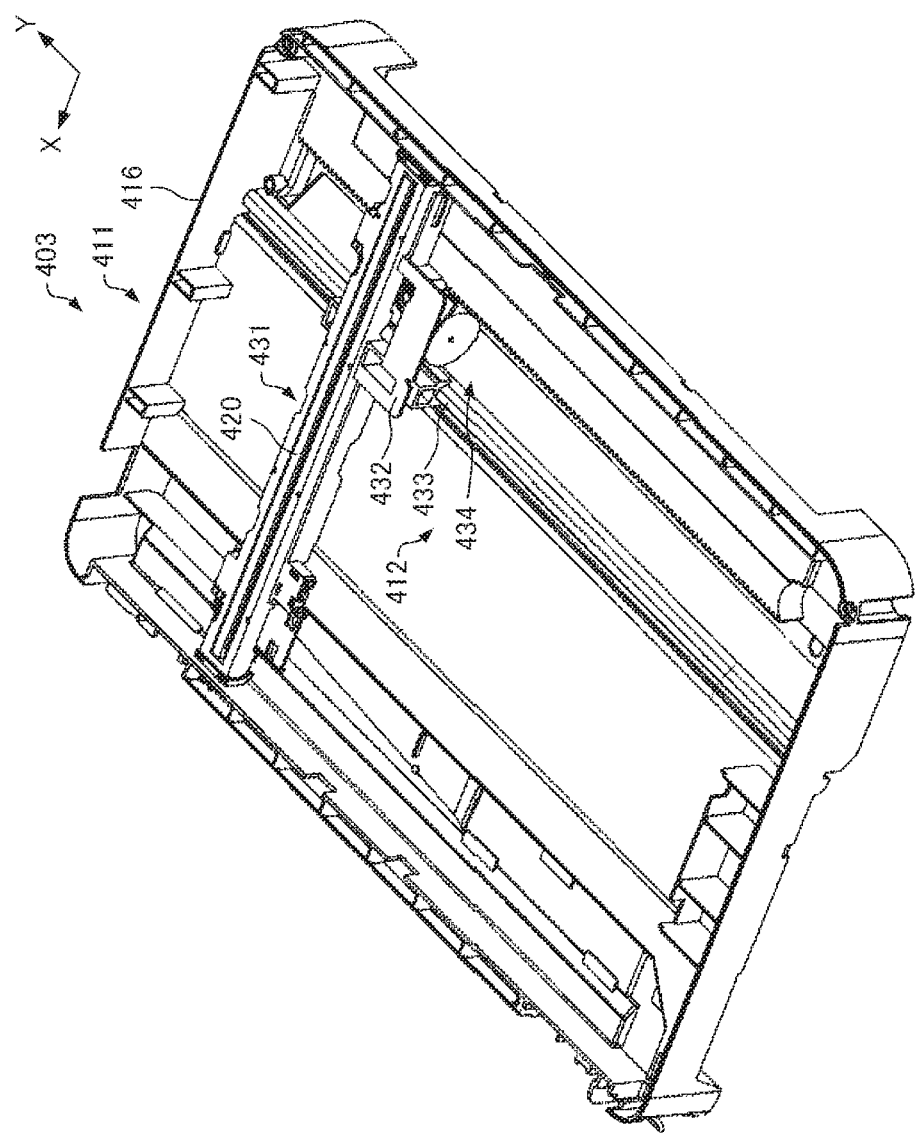
FIG. 19 is a perspective view schematically showing an internal structure of a scanner unit of the multifunction machine according to the fourth embodiment.

FIG. 19 is a perspective view schematically showing an internal structure of the scanner unit 403. As shown in FIGS. 18 and 19, the scanner unit 403 includes an upper frame 411, which is a housing, an image reading portion 412, which is accommodated in the upper frame 411, an image sensor module 420, and an upper lid 413, which is pivotably supported by an upper portion of the upper frame 411. As shown in FIG. 19, the upper frame 411 includes a box-shaped lower case 416, which accommodates the image reading portion 412 and the image sensor module 420, and an upper case 417, which covers a top surface of the lower case 416. A document placement plate (not shown) that is made of glass, namely a document plate is widely installed over the upper case 417, and a medium that is to be read, namely a document is placed thereon with a face to be read facing downward. Meanwhile, the lower case 416 is formed to have a shallow box shape that is open in its upper face.

Figure 20:
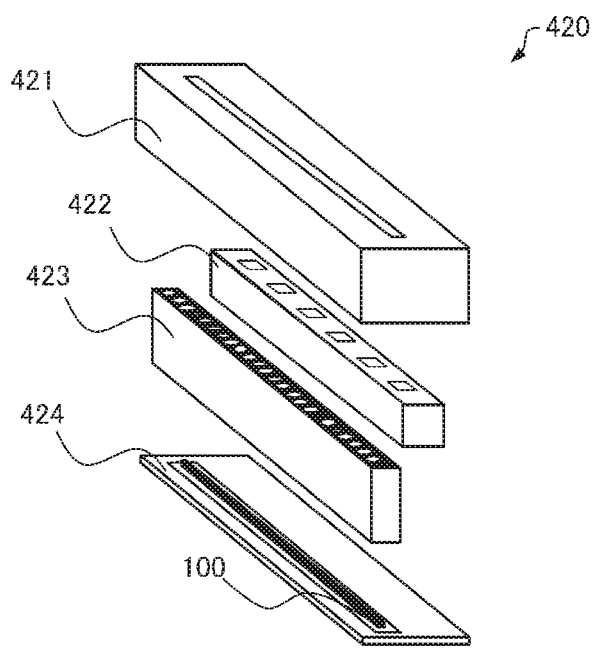
FIG. 20 is an exploded perspective view schematically showing a configuration of an image sensor module of the multifunction machine according to the fourth embodiment.

FIG. 20 is an exploded perspective view schematically showing a configuration of an image sensor module 420. In the example shown in FIG. 20, the image sensor module 420 includes a case 421, a light source 422, a lens 423, a module substrate 424, and solid-state image sensors 100 for reading an image. The light source 422, the lens 423, and the solid-state image sensors 100 are accommodated between the case 421 and the module substrate 424. The case 421 is provided with a slit. The light source 422 has R, G, and B light-emitting diodes (LEDs), and causes red LEDs, green LEDs, and blue LEDs to emit light in turn while rapidly switching therebetween. Light emitted by the light source 422 is applied to a medium to be read via the slit, and the light from the medium to be read is input to the lens 423 via the slit. The lens 423 guides the input light to the solid-state image sensor 100.

The solid-state image sensors 100 read an image formed on the medium to be read, based on light that is light applied by the light source 422 reflected off the medium to be read. Specifically, in the solid-state image sensors 100, carriers are accumulated in the pixels 2 in accordance with the incident light. The amplifier circuit that is electrically coupled to the pixels 2 reads out and amplifies voltages corresponding to the amounts of carriers accumulated in the pixels 2, and outputs the amplified voltages as output signals. The scanner unit 403 generates an image based on the output signals that are output for the respective pixels 2 by the amplifier circuit.

Figure 21:
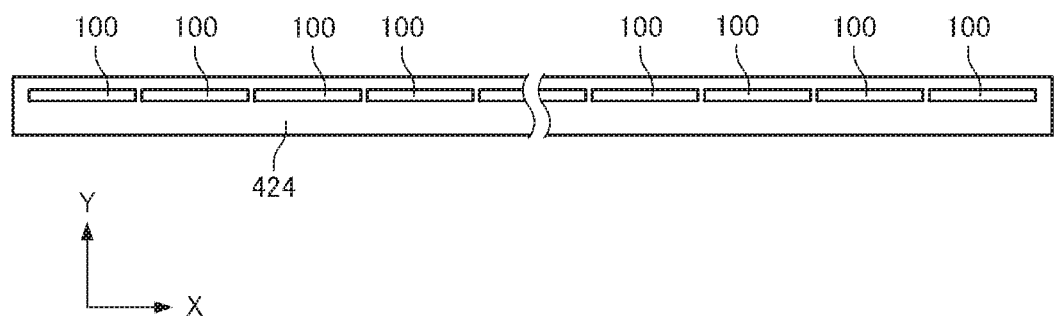
FIG. 21 is a plan view schematically showing a solid-state image sensor of the multifunction machine according to the fourth embodiment.

FIG. 21 is a plan view schematically showing the solid-state image sensors 100. As shown in FIG. 21, a plurality of solid-state image sensors 100 are arranged on the module substrate 424 in the X-axis direction. The length of one solid-state image sensor 100 in the X-axis is 10 mm or more and 20 mm or less, for example.

Note that the solid-state image sensors 100 are applicable to both a color scanner and a monochrome scanner.

In the present disclosure, some of the configurations may be omitted within the scope where the characteristics and effects described in the present application are exhibited, and the embodiments and the modifications may be combined.

The present disclosure is not limited to the above-described embodiments, and more various modifications may be made. For example, the present disclosure includes substantially the same configurations as those described in the embodiments. "Substantially the same configurations" means configurations that have the same functionalities, methods, and results, or configurations that have the same objects and effects, for example. Also, the present disclosure includes a configuration in which portions thereof described in the embodiments that are not essential are replaced. Also, the present disclosure includes a configuration that exhibits the same effects as those described in the embodiments or a configuration that enables the same object to be achieved. Also, the present disclosure includes a configuration that is achieved by adding a known technique to the configurations described in the embodiments.

What is claimed is:

1. A solid-state image sensor comprising:
   a first impurity region of a first conductivity type;
   a plurality of second impurity regions of a second conductivity type disposed in the first impurity region and arranged in a first direction;
   a plurality of pinning layers having the first conductivity type, the plurality of pinning levers being disposed in surface regions of the plurality of second impurity regions and arranged in the first direction; and
   a light shielding layer that overlaps the first impurity region and does not overlap the plurality of second impurity regions and the plurality of pinning layers in a plan view,
   wherein the first impurity region has a first portion between adjacent ones of the plurality of second impurity regions,
   the light shielding layer has a second portion that overlaps the first portion in the plan view, and
   a length of the second portion in the first direction is smaller than a length of the first portion in the first direction.

2. The solid-state image sensor according to claim 1, wherein the light shielding layer is an interconnect layer electrically coupled to the first impurity region.

3. The solid-state image sensor according to claim 2, wherein the light shielding layer is configured to be applied a ground potential.

4. The solid-state image sensor according to claim 1, wherein, in the plan view, a first distance between one of adjacent ones of the plurality of second impurity regions and the second portion is equal to a second distance between another one of the adjacent ones of the plurality of second impurity regions and the second portion.

5. The solid-state image sensor according to claim 4,
wherein an impurity concentration in the plurality of second impurity regions is $1\times10^{13}$ atom/cm$^3$ or more and $1\times10^{17}$ atom/cm$^3$ or less, and the first distance and the second distance are 0.4 µm.

6. The solid-state image sensor according to claim 1, further comprising:

depletion layers constituted by the plurality of second impurity regions and portions of the first impurity region, wherein the length of the second portion in the first direction is smaller than or equal to a distance between adjacent ones of the depletion layers in the first direction.

7. The solid-state image sensor according to claim 1, wherein the light shielding layer has a third portion, in the plan view, the third portion is located in a second direction with respect to the plurality of second impurity regions, and the second direction is orthogonal to the first direction, and in the plan view, the third portion is spaced apart from the plurality of second impurity regions.

8. The solid-state image sensor according to claim 1, further comprising:

another light shielding layer that overlaps the light shielding layer in the plan view, wherein the another light shielding layer has a fourth portion that overlaps the first portion in the plan view, and a length of the fourth portion in the first direction is smaller than the length of the first portion in the first direction.

9. An image reading device comprising:

a light source; and the solid-state image sensor according to claim 1 that reads an image formed on a medium to be read based on reflected light, the reflected light being formed by reflecting light from the light source at the medium to be read.

10. The solid-state image sensor according to claim 1, further comprising:

depletion layers constituted by the plurality of second impurity regions and portions of the first impurity region, wherein the light shielding layer is configured to irradiate the depletion layers with light.

* * * * *